United States Patent [19]
Mnich et al.

[11] Patent Number: 5,262,998
[45] Date of Patent: Nov. 16, 1993

[54] DYNAMIC RANDOM ACCESS MEMORY WITH OPERATIONAL SLEEP MODE

[75] Inventors: Thomas M. Mnich, Woodland Park; William D. Miller, Colorado Springs, both of Colo.

[73] Assignee: Micron Technology, Inc., Boise, Id.

[21] Appl. No.: 744,989

[22] Filed: Aug. 14, 1991

[51] Int. Cl.⁵ .............................................. G11C 7/00
[52] U.S. Cl. ..................................... 365/222; 365/227
[58] Field of Search ............... 365/193, 194, 222, 227, 365/226

[56] References Cited

U.S. PATENT DOCUMENTS

| | | | |
|---|---|---|---|
| 4,688,196 | 8/1987 | Inagaki et al. | 365/222 |
| 4,984,216 | 1/1991 | Toda et al. | 365/222 X |
| 4,989,183 | 1/1991 | Kumanoya et al. | 365/222 |

Primary Examiner—Joseph A. Popek
Attorney, Agent, or Firm—Susan B. Collier

[57] ABSTRACT

A dynamic memory device exhibits a sleep mode of operation, entered in response to a single externally-applied signal which need not be cycled. While in this sleep mode, the device does not respond to or require any of the usual DRAM control signals such a $\overline{RAS}$, $\overline{CAS}$, write enable, address inputs, data inputs, etc., so all of these signals may be in a quiescent state. An internal refresh counter is used to generate row addresses while in the sleep mode, and timing for the internal refresh is provided by an internal oscillator. The memory device cycles through a sequence of row addresses for refresh while in this sleep mode, using an internal refresh address counter, and this sequence may be maintained without interruption if the sleep mode is reentered within a normal refresh period after exiting the sleep mode. Thus, a sleep-exception mode of operation is provided in which normal read or write cycles can be interposed between sleep mode periods, so the overall power drain is very low but normal access is maintained at a relatively active level.

24 Claims, 3 Drawing Sheets

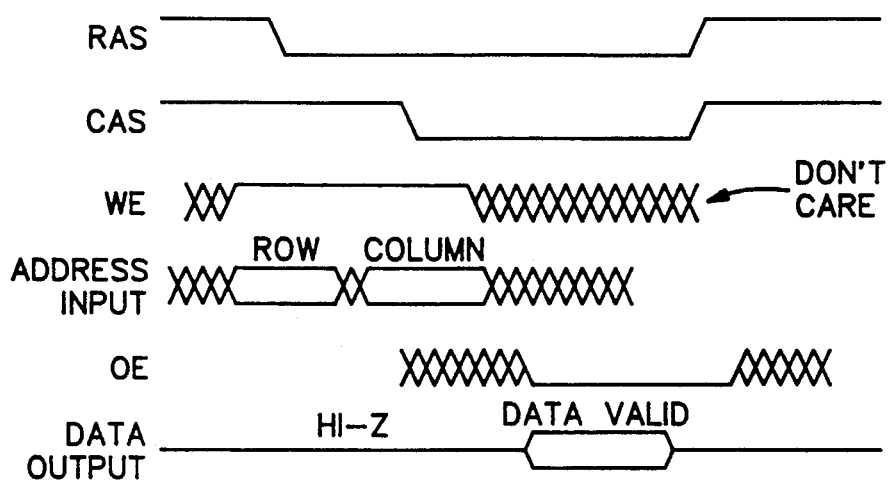
FIG. 2    READ OPERATION
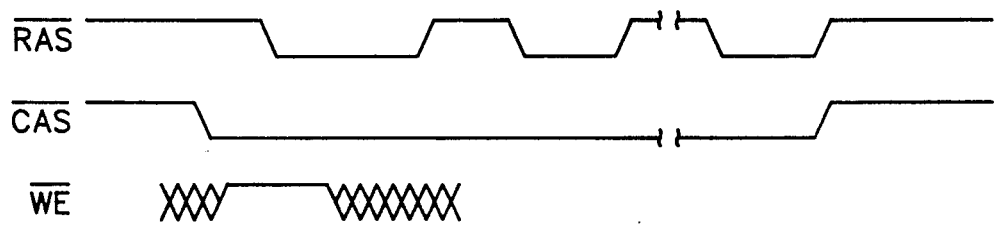
FIG. 3    CAS BEFORE RAS REFRESH
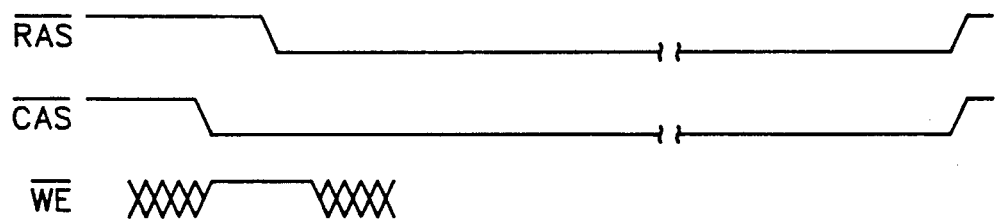
FIG. 4    AUTO-REFRESH
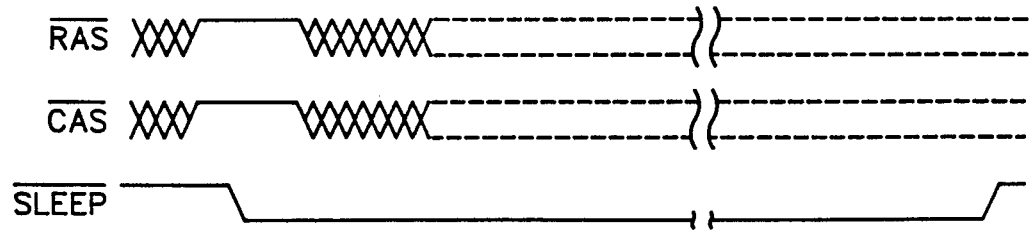
FIG. 5    SLEEP MODE

DYNAMIC RANDOM ACCESS MEMORY WITH OPERATIONAL SLEEP MODE

BACKGROUND OF THE INVENTION

This invention relates to semiconductor memory devices, and more particularly to a dynamic memory device having a refresh mode.

Battery-operated computers are constructed with circuitry tailored for reducing the standby power required. The DRAMs used to construct the main memory are a significant part of the circuitry of a laptop computer or the like, and so are a target for power reduction in the standby mode. A memory that is non-volatile is a necessity, so that data can be preserved during idle periods. If this non-volatile memory can be constructed using DRAMs the parts cost is greatly reduced, so DRAMs with battery back-up are utilized. The requirement for refresh is the main problem is using DRAMs in this manner. A DRAM must be periodically refreshed to avoid deterioration of stored data. Various standby modes for DRAMs have been proposed, and parts are manufactured using some of these concepts. For example, DRAMs are produced having battery backup modes using very low current, but requiring unconventional sequencing of the address strobes, and lengthy recovery periods when exiting the backup mode, before normal read or write cycles can be executed. Other such products achieve low standby current, but require the system to cycle the address strobe, which more than offsets the current savings in the component.

In prior approaches, therefore, the goal of low standby current drain has been achieved at the expense of either a long recovery period before normal operation can be resumed, or an increase in the system power requirements, offsetting the power savings in the DRAMs devices.

It is the principal object of this invention to provide an improved low-power standby mode of operation of dynamic memory device. Another object is to provide a low-power mode of operation of a dynamic memory in which the device recovers from this mode quickly and read and write operations can be performed without delay. A further object is to provide a low-power mode of operation of a memory device without increasing the power drain on other parts of the system due to signals needed to maintain the memory device in the standby mode.

SUMMARY OF THE INVENTION

In accordance with one embodiment of the invention, a dynamic memory device has a sleep mode of operation, entered in response to a single externally-applied signal which need not be cycled. While in this sleep mode, the device does not respond to or require any of the usual DRAM control signals such a $\overline{RAS}$, $\overline{CAS}$, write enable, address inputs, data inputs, etc., so all of these signals may be in a quiescent state. An internal refresh counter is used to generate row addresses while in the sleep mode, and timing for the internal refresh is provided by an internal oscillator. The memory device cycles through a sequence of row addresses for refresh while in this sleep mode, using an internal refresh address counter, and this sequence may be maintained without interruption if the sleep mode is reentered within a normal refresh period after exiting the sleep mode. Thus, a sleep-exception mode of operation is provided in which normal read or write cycles can be interposed between sleep mode periods, so the overall power drain is very low but normal access is maintained at a relatively active level.

In another embodiment of the invention, instead of employing the sleep-mode pin, the standard DRAM control pins are used. The sleep mode is entered by first invoking an autorefresh mode using the standard $\overline{CAS}$ before $\overline{RAS}$ sequence, then bringing $\overline{CAS}$ high while $\overline{RAS}$ remains low to signify that the sleep mode is to be entered rather than a lower power autorefresh mode. The sleep mode, as above, is distinguished in that a read or write cycle may be started immediately when sleep mode is exited, whereas the other low power standby mode takes longer to recover from.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

FIG. 2 is a timing diagram in which voltage is plotted as a function of time, illustration events occurring in the device of FIG. 1 for a read operation;

FIG. 3 is a timing diagram as in FIG. 2, illustrating events occurring in the device of FIG. 1 for a standard $\overline{CAS}$ before $\overline{RAS}$ refresh operation;

FIG. 4 is a timing diagram as in FIG. 2, illustrating events occurring in the device of FIG. 1 for an autorefresh operation;

FIG. 5 is a timing diagram as in FIG. 2, illustrating events occurring in the device of FIG. 1 for a sleep mode of operation, according to the invention;

DETAILED DESCRIPTION OF SPECIFIC EMBODIMENTS

Figure 1:
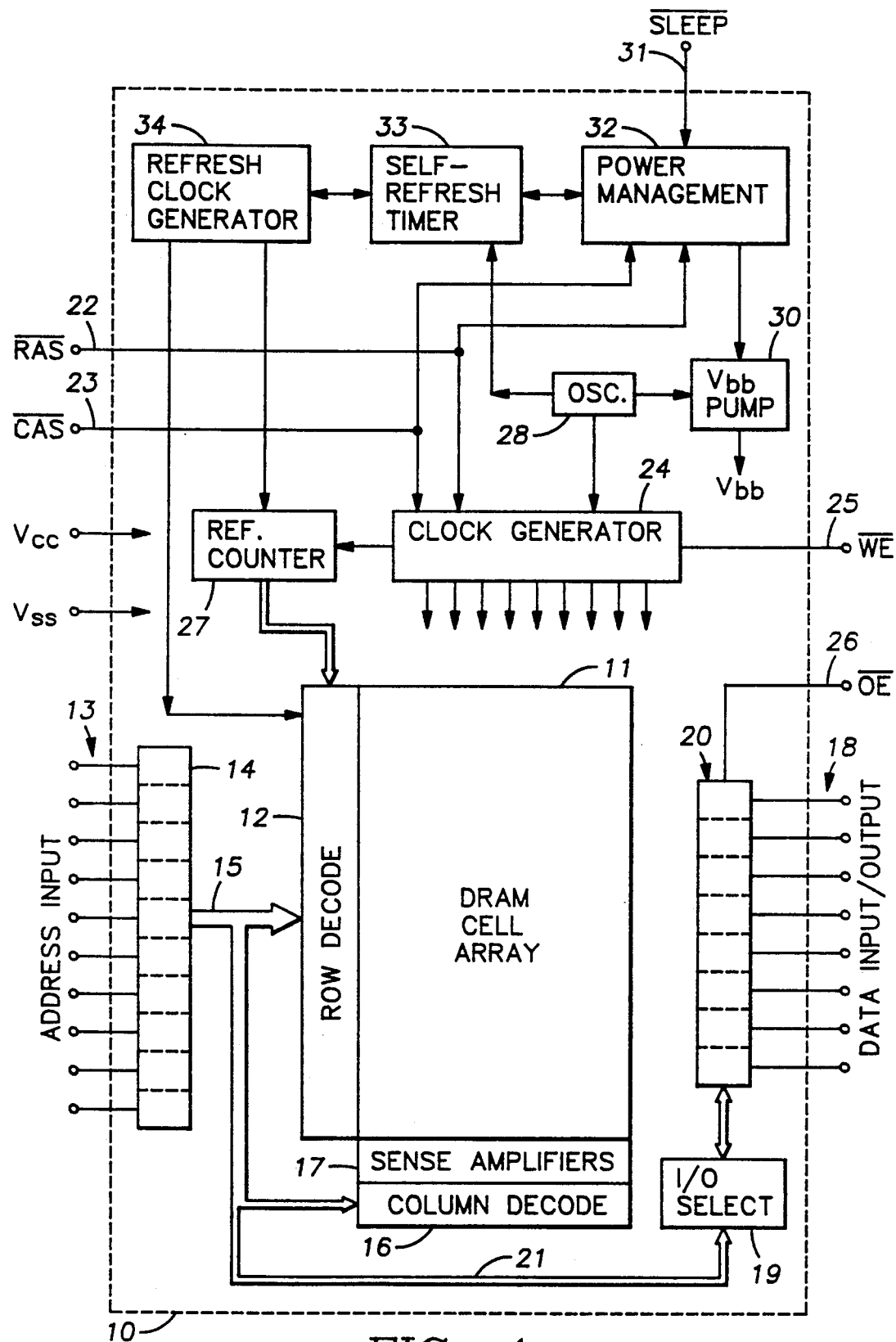
FIG. 1 is an electrical diagram in block form of a dynamic memory device having refresh mode providing a sleep operational condition, according to one embodiment of the invention.

Referring to FIG. 1, a dynamic RAM device is illustrated which may utilize features of the invention, according to one embodiment. This device is in the form of a semiconductor integrated circuit chip 10 containing a memory cell array 11 of a suitable size, e.g., 1-Mbit, 4-Mbit, 16-Mbit, 64-Mbit, etc., arranged in rows and columns. The cell array 11 is addressed by row and column address circuitry including a row decoder 12 receiving a row address from input pins 13 and address buffers 14, via row address bus 15. The address is multiplexed, so a column address is also applied via the pins 13 and buffers 14 to a column decoder 16. The columns of the cell array (bit lines) are connected to sense amplifiers 17, and a column decoder 16 selects some number of bits for input or output during a given write or read cycle. All of the sense amplifiers are activated on every active read or write cycle (and on every refresh cycle). The data lines selected by the column decoder 16 are more than the number of data I/O pins 18, so another selection is made in an I/O selector 19 connected between the column decoder 16 and a set of data I/O buffers 20. Certain bits of the column address from address buffers 14 are connected to the selector 19 by lines 21. The number of data I/O pins 18, the number of address pins 13, and the configuration of the address bits used in the various decoders 12, 16 and 19, are all dependent upon the size of the array 11 and whether "by-1", "by-8" or "by-16" data I/O is desired. For example, a 4-Mbit memory device using a by-4 data I/O would have ten address bits, multiplexed, so there is a 20-bit address; if the number of rows is 1024, the number of columns is also 4096, for which the column select may be split so that there are seven bits going to the decoder 16 (selecting 32-of-4096), and three bits going to the selector 19 (selecting 4-of-32). Other memory sizes and data I/O configuration, e.g. 16-Mbit with by-8 I/O, would be correspondingly configured.

Referring to FIG. 1 and to the timing diagram of FIG. 2, the multiplexed addresses are accepted from the address pins 13 into the address buffers 14 under control of row and column address strobes $\overline{RAS}$ and $\overline{CAS}$ on inputs pins 22 and 23. The address strobes are applied to a read/write clock generator 24 which generates internal clocks for driving the address buffers, the decoders, the sense amplifiers, etc., in the usual manner. The selection of what operation is being done in an active cycle is done by a write enable or $\overline{WE}$ input pin 25, also coupled to the clock generator 24. If the write enable pin is active-low, the cycle is a write cycle and data will be accepted from the input/output pins 18 and written to the cell array 11, via the sense amplifiers 17. On the other hand, if the write enable pin 25 is inactive-high, the cycle is a read cycle (illustrated in FIG. 2) and data extracted from the cell array 11 via the sense amplifiers 17 will be driven onto the data input/output pins 18. A read cycle is established by $\overline{RAS}$ falling before $\overline{CAS}$ and $\overline{WE}$ being high, while a write cycle is established by $\overline{RAS}$ before $\overline{CAS}$ with $\overline{WE}$ low. An output enable $\overline{OE}$ signal is applied to buffer 20 in the device 10 by an input pin 26 to establish when the buffers 20 are allowed to drive an external data bus. Only when $\overline{OE}$ is active-low can the pins 18 be driven by the data buffers 20.

The cell array 11 employs one-transistor dynamic memory cells wherein data bits are stored on capacitors which inevitably leak, causing the stored data to deteriorate after a period of time, so the data must be refreshed periodically. Typically a refresh specification may require that every cell must be addressed at least once every 15-milliseconds. The action of the sense amplifiers 17 in reading the cell will generate a full-value data bit for writing back into the cell, thus refreshing the stored data bit to full value whenever the cell is addressed. Several refresh mechanisms are available to DRAMs currently marketed, and the device of FIG. 1 employs the standard mechanisms, as well as an improved refresh mode as will be described below. One of the conventional refresh modes is so-called $\overline{CAS}$ before $\overline{RAS}$ refresh. If $\overline{CAS}$ falls before $\overline{RAS}$ as seen in FIG. 3, this signals a refresh cycle in which the row address for refresh is held in a register 27 on the chip. There is no data input or output during this operation, and no address is accepted. The $\overline{WE}$ signal must be high, signalling a read, when $\overline{RAS}$ falls for this type of refresh operation. The $\overline{OE}$ signal is ignored (i.e., "don't care") in a standard $\overline{CAS}$ before $\overline{RAS}$ refresh. There may be only one refresh cycle if $\overline{RAS}$ and $\overline{CAS}$ return to the high level, or there may be a continuous sequence of refresh cycles performed if $\overline{RAS}$ is toggled every 15 $\mu$sec (max) and $\overline{CAS}$ is held down; in this series, every time $\overline{RAS}$ falls the row address register 27 is incremented and loaded into the buffers 14.

In addition to the standard $\overline{CAS}$ before $\overline{RAS}$ refresh of FIG. 3, an auto-refresh cycle is also available which does not require cycling $\overline{RAS}$. A row address for refresh is generated and stored on-chip in a counter 27 and applied to the row decoder 12 under control of the clock generator 24 when this auto-refresh cycle is signalled by externally-applied waveforms. Again, this type of refresh is signaled by $\overline{CAS}$ falling before $\overline{RAS}$, with the sequence as shown in FIG. 4 again requiring the write enable signal on input pin 25, $\overline{WE}$, to be held high when $\overline{RAS}$ falls. After one initial standard refresh, if $\overline{RAS}$ and $\overline{CAS}$ are held down indefinitely, the device enters and stays in this self-refresh mode, generating a sequence of refresh operations periodically based on timing generated by an internal oscillator 28. Since there are no refresh timing signals provided by $\overline{RAS}$ and $\overline{CAS}$ under these conditions, a counter must be included in the clock generator 24 to keep track of time and to cause the clock generator 24 to trigger the refresh counter 27 to increment and provide a new address to the row decoder 12 every several microseconds, so that the entire array 11 is addressed once in a refresh period of 15-ms. Most DRAMs have a substrate pump 30 to generate a voltage Vbb to bias the substrate, as is conventional. The same internal oscillator 28 may be used to time the refresh as is used to maintain the substrate bias. This operational mode is useful in applications where memory contents are to be maintained by battery power, or other systems were the memory is inactive for long periods of time. To this end, all non-essential circuitry on the chip is disabled to conserve power. The clocks generator circuitry for clocks not used in auto-refresh is disabled and nodes in this circuitry are allowed to discharge. Similarly, the address buffers 14 and I/O buffers 20, and the column decoder 16 are inactivated and internal nodes allowed to discharge. Because so much of the chip is disabled, this operating mode will require a longer period of time before resuming normal read and write cycles. Thus, a period of time is specified after $\overline{RAS}$ and $\overline{CAS}$ go high (after an auto-refresh condition) before a read cycle of FIG. 2 can be initiated.

According to the invention, an additional refresh mode is provided, referred to as a "sleep" mode. An additional input pin 31 is included, driven by a $\overline{SLEEP}$ signal. A control circuit 32 receives this signal from pin 31 and receives the $\overline{RAS}$ and $\overline{CAS}$ signals from the pins 22 and 23 and the $\overline{WE}$ signal from pin 25, and detects a condition as seen in FIG. 5 where the $\overline{SLEEP}$ signal is low while $\overline{RAS}$ and $\overline{CAS}$ are high and $\overline{WE}$ is high. A sleep mode is entered when these conditions are detected, in which a refresh timer 33 is activated to generate a refresh cycle every 15 $\mu$sec, responsive to the oscillator 28. The refresh cycle activates a sleep-mode refresh clock generator 34 which produces controls to activate the internal refresh counter 27 and cause it to be incremented and to supply an address to the row decoder 12, every time the refresh cycle is signalled by the control 32. While in this sleep mode, the chip is not powered down to the extent ordinarily done in the auto-refresh mode of FIG. 4, and so immediately upon the $\overline{SLEEP}$ signal going high (inactive) the device will respond to ordinary read and write cycles of FIG. 2 with standard timing. The device in sleep mode uses less power than standard $\overline{CAS}$ before $\overline{RAS}$ refresh because the input buffers are not being toggled to receive addresses, $\overline{RAS}$ and $\overline{CAS}$ are not toggling, etc. But the internal clocks continue to operate in the sense of having nodes charged, and will immediately respond.

Figure 6:
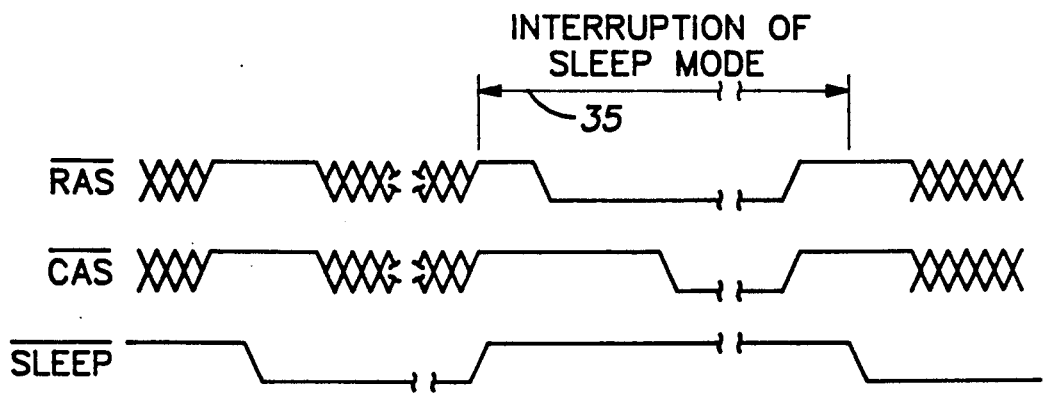
FIG. 6 is a timing diagram as in FIG. 5, illustrating events occurring in the device of FIG. 1 for a sleep-exception mode, according to the invention.

Referring to FIG. 6, a particular feature of the sleep mode is the ability to interrupt the sleep mode to do read and write cycles and yet to return to the same refresh sequence without starting over. This is referred to as the sleep exception mode, and is effective so long as the period 35 of interruption does not exceed the minimum refresh interval of 15 μsec. That is, during the period 35 the $\overline{SLEEP}$ signal is raised as seen in FIG. 6, and normal read and write cycles performed by toggling $\overline{RAS}$, $\overline{CAS}$, $\overline{WE}$ and $\overline{OE}$, for a period of up to 15 μsec, then the sleep signal on pin 31 falls again at the end of period 35 and sleep mode is reentered; the count registered in the counter 29 is resumed without interruption, two refresh cycles are performed in rapid succession, then refresh continues at the usual rate of one per 15 μsec. This 15 μsec period 35 of random read and write activity would allow over 256 read or write operations using fast page mode, in this interval.

The sleep mode as described above, according to the invention, differs from the conventional auto-refresh mode in several important respects. First, the sleep mode will use more power than the auto-refresh mode (also referred to as a battery backup mode) because more of the circuitry stays active and ready to respond immediately to a read or write cycle after the sleep mode is exited. Secondly, the sleep mode is controlled by a single pin, the $\overline{SLEEP}$ signal on pin 31, rather than a combination of input signals; while in the sleep mode the signals on all the other pins are ignored and can be driven in any way as may occur, or more importantly can be shut off completely, saving system power—only one signal, $\overline{SLEEP}$, need be held at a certain level, and that level is ground. Third, the resumption of normal random read and write cycles after exiting sleep mode will be within one normal random read or write cycle time. Fourth, the sleep mode will allow interruption to perform normal read and write cycles, then resumption of sleep mode without restarting the refresh address sequence, if this interruption is no longer than a normal refresh period; this is the so-called sleep exception mode.

Figure 7:
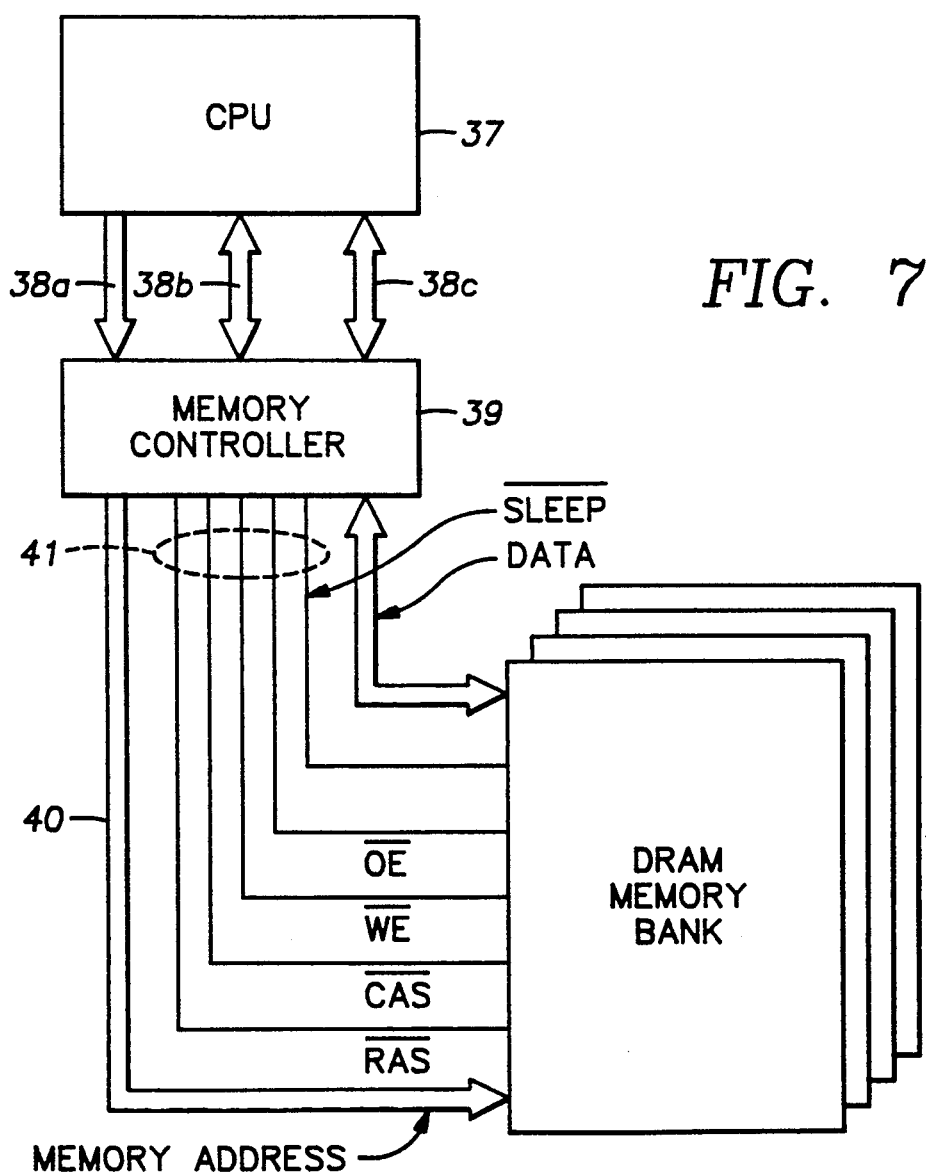
FIG. 7 is an electrical diagram in block form of a computer system having a DRAM memory employing the devices of the invention.

Because the sleep mode can be entered and exited very quickly, sleep mode cycles can be used whenever random read and write cycles are not being performed, thereby reducing overall system operating power. The sleep exception mode permits the overall system power consumption to be reduced for two reasons. Referring to FIG. 7, a computer system employing the devices described above typically has a CPU 37 generating memory references on a system bus including an address bus 38a, a data bus 38b and a control bus 38c; a memory controller 39 is employed to generate the multiplexed addresses on memory bus 40, using the non-multiplexed address on system bus 38a, and generating the $\overline{RAS}$, $\overline{CAS}$, $\overline{WE}$ and $\overline{OE}$ signals on the control lines 41 from the memory controls on system bus 38c. The sleep mode may be entered under command from the CPU 37, but the memory controller 39 would actually generate the $\overline{SLEEP}$ signal in proper relation to $\overline{RAS}$ and $\overline{CAS}$. Or, the memory controller can generate the sleep mode whenever a period of inactivity (no memory access cycles) from the CPU occurs. The memory controller can thus exit sleep mode when a memory access is received, in which case the sleep mode may be transparent to the CPU. Overall power consumption is reduced, first, because no clocked lines in the system bus 38a or 38c, or from the memory controller 39, are required to switch states when in the sleep mode. Second, the sleep mode uses less power than an active read or write mode since external lines in the system bus or lines driven by the memory controller are not being toggled, and internal buffers are not being driven, and uses less power than conventional $\overline{CAS}$ before $\overline{RAS}$ refresh since $\overline{RAS}$ need not be toggled and addresses need not be driven on external lines of FIG. 7. The amount of power savings will be proportional to the ratio of time spent in active mode versus the time spent in sleep mode.

This improved refresh mode, according to the invention, preserves the standard operating modes, signals, pin-out, and specifications of a DRAM as widely marketed today, and preserves the existing operating specifications for the low power battery backup mode (the auto-refresh mode). In addition, an entirely new operating mode is added which is controlled by an additional pin on the device. This new sleep mode is a low power standby mode employing on-chip refresh address generation. A particular feature is that of allowing rapid resumption of active cycles after exiting the sleep mode. A sleep exception mode permits reduction of overall system power by interposing read and write cycles by exiting and then reentering the sleep mode within a normal refresh repeat period.

In another embodiment of the invention, the sleep mode and the battery back-up mode may be controlled from a $\overline{CAS}$-before-$\overline{RAS}$ type of timing in which both low-power standby modes are entered by a standard $\overline{CAS}$-before-$\overline{RAS}$ sequence of FIGS. 3 or 4. Since exiting either of these modes of operation requires returning $\overline{RAS}$ high in preparation for the next cycle, it is possible to remain in the low-power standby while $\overline{CAS}$ is returned high. This provides the option of entering low-power standby with $\overline{CAS}$-before-$\overline{RAS}$, as in FIG. 4, then holding both low for one standard refresh interval (e.g., 15 μsec); after that point if $\overline{CAS}$ remains low then battery-backup mode is entered, or if $\overline{CAS}$ returns high then sleep mode as described above is entered. The advantage of this embodiment is that no sleep pin 31 is needed.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A dynamic memory device having a read or write mode of operation, an auto refresh mode of operation, and a sleep mode of operation, comprising:
   means responsive to occurrence of a row address strobe followed by a column address strobe applied to said device to invoke said read or write mode;
   means responsive to occurrence of said column address strobe followed by said row address strobe applied to said device to invoke said auto-refresh mode when said column address strobe and said following row address strobe occur for a given time; and means responsive to a sleep signal applied to said device while said row and column address strobes are in an inactive state to invoke said sleep mode.

2. A device according to claim 1 wherein said sleep mode is immediately followed by a read or write mode when said sleep signal is removed and said row and column address strobes are applied to said device.

3. A device according to claim 1 wherein said sleep mode includes periodically generating an internal refresh address in a sequence and addressing a row of an array of memory cells using said address.

4. A device according to claim 3 wherein said means responsive to a sleep signal continues said sequence if said sleep mode is resumed after a previous sleep mode has been terminated for less than a selected time.

5. A device according to claim 1 wherein said memory device includes an array of rows and columns of dynamic memory cells.

6. A device according to claim 5 wherein said auto-refresh mode includes periodically generating an internal refresh address and addressing a row of said array of memory cells using said address.

7. A device according to claim 6 wherein said sleep mode also includes periodically generating an internal refresh address and addressing a row of said array of memory cells using said address.

8. A method of operating a dynamic memory device to provide a read or write mode of operation, an auto refresh mode of operation, and a sleep mode of operation, comprising the steps of:

applying a row address strobe followed by a column address strobe to said device to invoke said read or write mode;

applying said column address strobe followed by said row address strobe to said device, wherein said column address strobe and said following row address strobe are applied for a given time, to invoke said auto-refresh mode; and applying a sleep signal to said device while said row and column address strobes are in an inactive state to invoke sleep mode.

9. A method according to claim 8 wherein said sleep mode is immediately followed by a read or write mode when said sleep signal is removed and said row and column address strobes are applied to said device.

10. A method according to claim 8 including the step of, during said sleep mode, periodically generating an internal refresh address in a sequence and addressing a row of an array of memory cells using said address.

11. A method according to claim 10 including continuing said sequence if said sleep mode is resumed after a previous sleep mode has been terminated for less than a selected time.

12. A method according to claim 8 wherein said memory device includes an array of rows and columns of dynamic memory cells.

13. A method according to claim 12 including, in said auto-refresh mode, periodically generating an internal refresh address and addressing a row of said array of memory cells using said address.

14. A method according to claim 13 including, in said sleep mode, also periodically generating an internal refresh address and addressing a row of said array of memory cells using said address.

15. A method of operating a memory device requiring refresh, comprising the step of:

entering a condition of sleep mode in response to an externally-applied signal, and, while in said condition of sleep mode, internally generating refresh addresses in a sequence and performing a refresh operation once every refresh period;

exiting from said condition of sleep mode in response to removal of said externally-applied signal, and performing read and write operations for a period of time no longer than said refresh period;

re-entering said condition of sleep mode in response to re-applying said externally-applied signal, and, while in said condition of sleep mode, continuing to generate said refresh addresses in said sequence without restarting said sequence, and again performing a refresh operation once every refresh period.

16. A method according to claim 15 wherein said sleep mode includes the steps of:

incrementing a refresh address counter;

applying said refresh address from said refresh address counter to a row address decoder.

17. A method according to claim 15 wherein said memory device receives an externally-applied row address strobe and an externally-applied column address strobe, and enters said sleep mode only when said row and column address strobes are both in an inactive state and said signal is in an active state.

18. A method according to claim 17 wherein said memory device is a dynamic random access memory constructed as an integrated circuit device.

19. A method according to claim 18 including the step of operating said memory device in a self-refresh mode when said memory device receives an externally-applied column address strobe followed by an externally-applied column address strobe, and said row and column address strobes are both held in an active state and said signal is in an inactive state.

20. A system comprising:

processor means generating memory control signals and generating row and column addresses and row and column address strobes;

dynamic memory means responsive to said row and column addresses and said row and column address strobes and memory control signals to perform read or write operations when said row address strobe is applied before said column address strobe, to perform an auto-refresh operation when said column address strobe is applied before said row address strobe and both row and column address strobes are held in an activated state, and to perform a sleep mode of operation when a sleep signal of said memory control signals is applied.

21. A system according to claim 20 wherein said memory means includes a number of memory devices, each having an internal refresh address generator and an internal oscillator, and means for generating an internal refresh operation at time periods responsive to said oscillator.

22. A method of operating a dynamic memory device to provide a read or write mode of operation, an auto refresh mode of operation, and a sleep mode of operation, comprising the steps of:

applying a row address strobe followed by a column address strobe to said device to invoke said read or write mode;

applying said column address strobe followed by said row address strobe to said device, wherein said column address strobe and said following row address strobe are applied for a given time, to invoke said auto-refresh mode; and applying said column address strobe followed by said row address strobe to said device for a given time, then removing said column address strobe, to invoke said sleep mode.

23. A method according to claim 22 wherein said sleep mode is immediately followed by a read or write mode when said sleep signal is removed and said row and column address strobes are applied to said device.

24. A method according to claim 22 including the step of, during said sleep mode, periodically generating an internal refresh address in a sequence and addressing a row of an array of memory cells using said address.

* * * * *